United States Patent [19]

Iwasawa et al.

[11] Patent Number: 4,826,360

[45] Date of Patent: May 2, 1989

[54] TRANSFER SYSTEM IN A CLEAN ROOM

[75] Inventors: Yoshiyuki Iwasawa; Tsutomu Ishida; Hiroshi Harada; Shintaro Kobayashi, all of Tokyo, Japan

[73] Assignee: Shimizu Construction Co., Ltd., Japan

[21] Appl. No.: 18,993

[22] Filed: Feb. 25, 1987

[30] Foreign Application Priority Data

| Mar. 10, 1986 | [JP] | Japan | 61-52058 |
| Mar. 24, 1986 | [JP] | Japan | 61-65117 |
| Mar. 24, 1986 | [JP] | Japan | 61-65118 |
| Apr. 9, 1986 | [JP] | Japan | 61-53388[U] |

[51] Int. Cl.$^4$ ............................................. B65G 51/32
[52] U.S. Cl. .................................... 406/51; 406/83; 406/110; 406/155; 406/164; 406/184; 414/217
[58] Field of Search ...................................... 406/1–10, 406/12, 13, 19, 26, 27, 151, 153–155, 164, 176–180, 184, 185, 51, 72, 73, 83, 109–112, 186–190; 414/217, 222

[56] References Cited

U.S. PATENT DOCUMENTS

| 839,646 | 12/1906 | Roberts | 406/185 X |
| 2,893,660 | 7/1959 | Cook et al. | 406/3 |
| 4,649,830 | 3/1987 | Tanaka | 414/217 X |
| 4,682,927 | 7/1987 | Southworth et al. | 414/217 |
| 4,705,444 | 11/1987 | Tullis et al. | 414/217 X |
| 4,739,882 | 4/1988 | Parikh et al. | 414/217 X |

FOREIGN PATENT DOCUMENTS 23026  1/1986  Japan .................................. 406/185

Primary Examiner—Sherman D. Basinger
Assistant Examiner—Paul E. Salmon
Attorney, Agent, or Firm—Kane, Dalsimer, Sullivan, Kurucz, Levy, Eisele and Richard

[57] ABSTRACT

A transfer system for transferring a SMIF pod TM in a clean room, in which the pod is adapted to contain a wafer cassette. The transfer system includes: at least one pair of SMIF arms TM, the arms disposed adjacent to a semiconductor processing apparatus for transferring wafers, carried in the wafer cassette, into and out of the semiconductor processing apparatus; a transfer tube disposed near the arms; a vehicle adapted to carry the pod and adapted to move within the transfer tube; evacuation mechanism for evacuating the transfer tube to produce a negative pressure within the transfer tube so that the vehicle is moved along an axis of the transfer tube due to the negative pressure; and at least one pair of conveying mechanisms for conveying the vehicle between the transfer tube and respective arms.

7 Claims, 17 Drawing Sheets

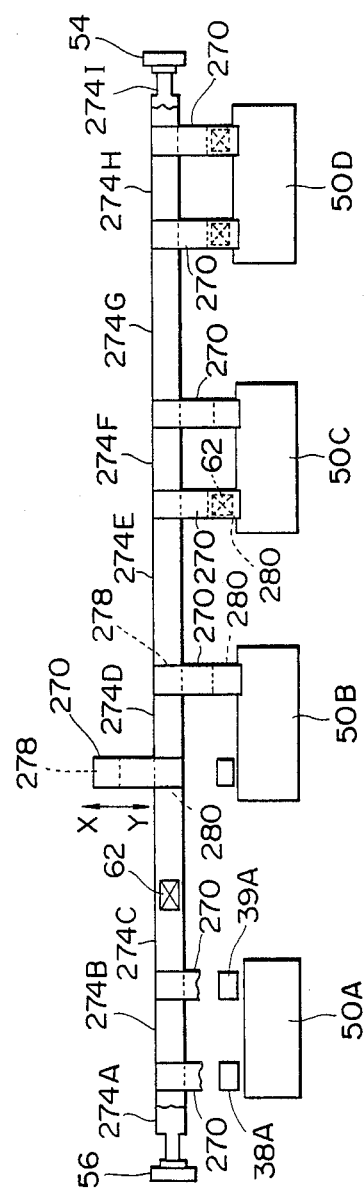

TRANSFER SYSTEM IN A CLEAN ROOM

BACKGROUND OF THE INVENTION

The present invention relates to a transfer system for transferring in a clean room a wafer cassette between semiconductor processing apparatuses for producing semiconductor devices such as very large-scale integrated circuits and large-scale integrated circuits.

In most of such conventional transfer systems, semiconductor processing apparatuses are placed within highly clean areas in a clean room, the areas being kept in a degree from 10 to 100 cleanliness class by using laminar air flow method. A wafer cassette which is loaded with wafers is transferred to a stacker crane of each highly clean area by means of an automatic wafer transport line using, for example, a linear motor carriage and then transported by a wafer automatic transfer robot to each of semiconductor processing apparatuses. This type of transfer system is disadvantageous in equipment cost and maintenance cost for producing a highly clean environment.

For overcoming these drawbacks, there has been, as illustrated in FIGS. 1 and 2, proposed a clean room using SMIF (TM) system, which includes a sealing cover 32 which covers over the top of a semiconductor processing apparatus 34, a clean air supply device 36 which incorporates both a high efficiency filter and a blower into it, a pair of SMIF arms (TM) 38 and 38 (hereinafter referred to as ARMs) which transfer wafer cassettes into and out of the semiconductor processing apparatus, and a pair of SMIF pods (TM) 40 (hereinafter referred to as pod). Each pod 40 includes a rectangular box door or removable bottom 42, on which a wafer cassette 44 is secured, and a box 46 which engages with the box door 42 for enclosing the wafter cassette 44 on the box door 42 in an airtight manner. Wafers 48 are loaded in the cassette 44 as illustrated in FIG 2. One pod 40 with wafer cassette 44 loaded with wafers 48 is manually placed on the top of one ARM 38 on the loading side and the other pod (not shown), having empty wafer cassette 44 received in it, is also manually placed on the top of the other ARM 39. Then, both the box door 42 and the wafter cassette 44, secured it, of each pod 40 are introduced into the corresponding ARM, from which only wafer cassette 44 is transferred into the semiconductor processing apparatus 34. Wafers 48 thus placed within the semiconductor processing apparatus 34 are sequentially subjected to processing and then transferred into the wafer cassette 44 on the unloading side. After this, the wafter cassette 44 loaded with the wafers 48 is returned back to the ARM 38 on the unloading side, where it is placed on the box door 42, which is then engaged with the box 42 placed on the top of that ARM 38 without exposing the wafers 48 to the atmosphere. The pod 40, containing the wafers 48 thus processed, is manually transported to another semiconductor processing apparatus for further processing. The following papers disclose the SMIF (TM) system: The Journal of Environmental Sciences, U.S.A., May/June '84 issue: "The Challenge to Control Contamination: A Novel Technique for the IC Process", page 23; Solid State Technology, U.S.A., July 1984, "SMIF, A Technology for Wafer Cassette Transfer in VLSI Manufacturing", page 111; and "Standard Mechanical Interface for Wafer Cassette Transfer" (Proposed), Document #1332, issued by Semiconductor Equipment and Materials Institute, Inc., U.S.A., Dec. 6, 1985.

The SMIF (TM) system ensures a high yield of product even in a clean room of a relatively low cleanliness, e.g., cleanliness class 1000 to 100000 since wafers are not allowed to be exposed to outside contamination and are placed in highly clean air during both processing and transportation thereof. However, both manual transportation of the pod 40 between semiconductor processing apparatuses and manual setting of pods 40 to respective ARMs 38, 39 are laborious.

SUMMARY OF THE INVENTION

Accordingly, it is an object of the present invention to provide a transfer system for transferring a pod in a clean room, in which costs in construction, equipment and maintenance of the clean room are considerably reduced.

It is another object of the present invention to provide a transfer system for transferring a pod in a clean room, in which transportation of the pod between various semiconductor processing apparatuses and setting thereof to the ARM are automatized, so that production cost of the semiconductor is considerably reduced.

With these and other objects in view, the present invention provide a transfer system for transferring a pod in a clean room, in which the pod is adapted to receive a wafer cassette. The transfer system includes: at least one pair of ARMs, the ARMs disposed adjacent to a semiconductor processing apparatus for transferring wafers, carried in the wafer cassette, into and out of the semiconductor processing apparatus; a transfer tube disposed near the ARMs; a vehicle adapted to carry the pod and adapted to move within the transfer tube; evacuation mechanism for evacuating the transfer tube to produce a negative pressure within the transfer tube so that the vehicle is moved along an axis of the transfer tube due to the negative pressure; and at least one pair of conveying mechanisms for conveying the vehicle between the transfer tube and respective arms.

BRIEF DESCRIPTION OF THE DRAWINGS

In the drawings:

FIG. 18 is a diagrammatic plan view of the second embodiment of the present invention;

DETAILED DESCRIPTION OF THE PREFERRED EMBODIMENTS

Figure 1:
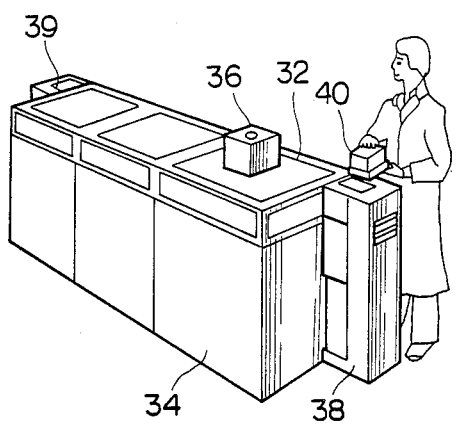
FIG. 1 is a perspective view of a semiconductor processing apparatus according to the prior art, using SMIF (TM) system.
Figure 2:
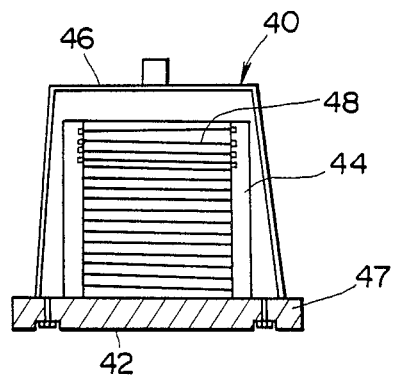
FIG. 2 is an enlarged vertical section of the pod in FIG. 1.
Figure 3:
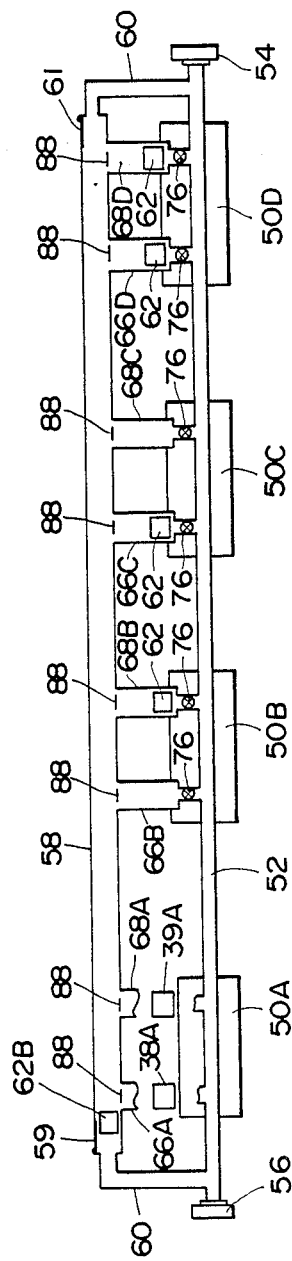
FIG. 3 is a diagrammatic view of a pod transfer system according to the present invention, in which first loading and unloading station tubes are partly broken away.
Figure 4:
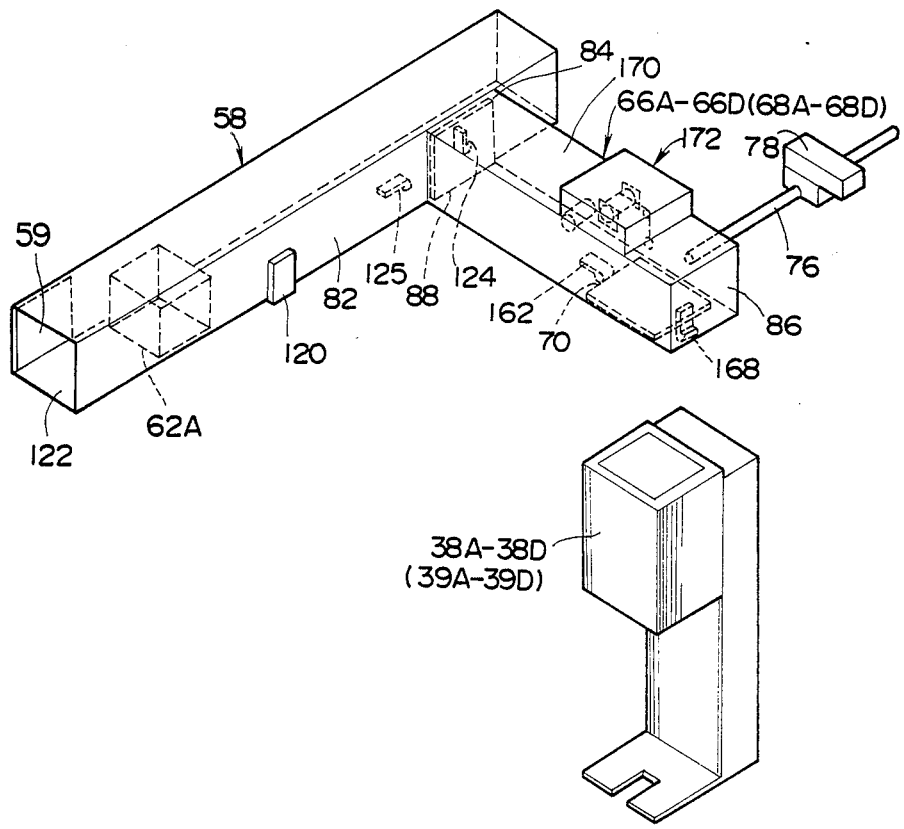
FIG. 4 is an enlarged perspective view of part of the transfer tube in FIG. 4 in which an arm is located just below a corresponding station tube.

In the drawings, like reference characters designate corresponding parts throughout views and descriptions of corresponding parts are omitted after once given. FIG. 3 illustrates a pod transfer system according to the present invention, in which four semiconductor processing apparatuses 50A, 50B, 50C and 50D for various production processes are aligned. The transfer system includes a duct 52 and a rectangular transfer tube 58 disposed parallel to the duct 52 and communicated at its opposite ends to the duct 52 through connecting tubes 60 and 60. The duct 52 is communicated at one end to a first blower 54 and at the other end to a second blower 56. The transfer system is horizontally disposed above the semiconductor processing apparatuses 50A–50D. The transfer tube 58 is designed so that a vehicle 62, which carries a pod 40 as illustrated in FIG. 13, is movable within it by vacuum pressure as described hereinafter. The transfer tube 58 has an inlet door 59 swingably mounted to its one end for introducing vehicles 62 into it and further has an outlet door 61 swingably attached to the other end for taking vehicles 62 out of it. The transfer tube 58 includes a pair of parallel rectangular station tubes 66A, 68A; 66B, 68B; 66C, 68C; and 66D, 68D branched near semiconductor processing apparatuses 50A–50D, respectively. As shown in FIG. 4, each of the loading station tubes 66A–66D and 68A–68D has an open proximal end 84 and a closed distal end 86 and has a square closure plate 70 mounted on a distal end portion of the bottom wall 72 (FIG. 11) thereof. ARMs 38A–38D and 39A–39D are installed just below the closure plates 70 of respective station tubes 66A–66D and 68A–68D as illustrated in FIG. 4. The station tubes 66A–66D and 68A–68D are each communicated at their distal ends to the duct 52 through a connecting duct 76 having a solenoid valve 78 incorporated in it. The station tubes 66A–66D constitutes loading station tubes and the station tubes 68A–68D constitutes unloading station tubes.

Figure 5:
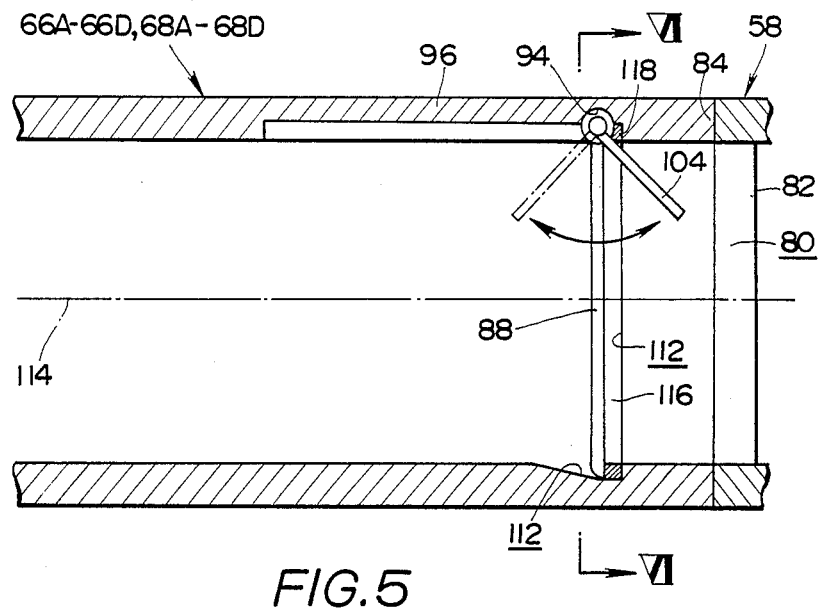
FIG. 5 is an enlarged vertical section of one end of the station tube in FIG. 4.
Figure 6:
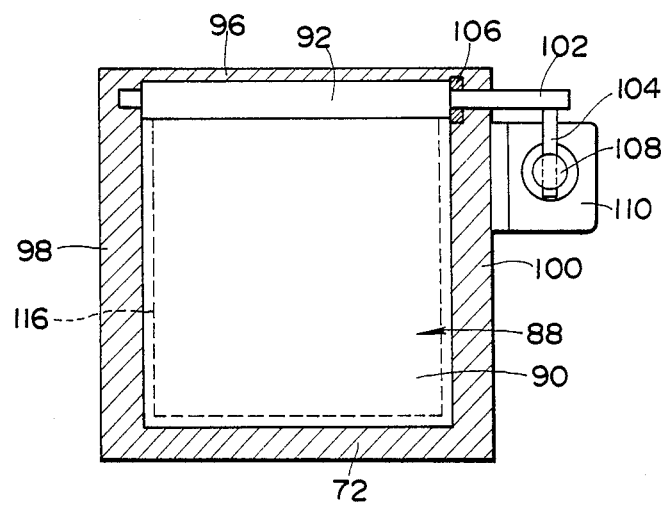
FIG. 6 is a view taken along the line VI—VI in FIG. 5.
Figure 7:
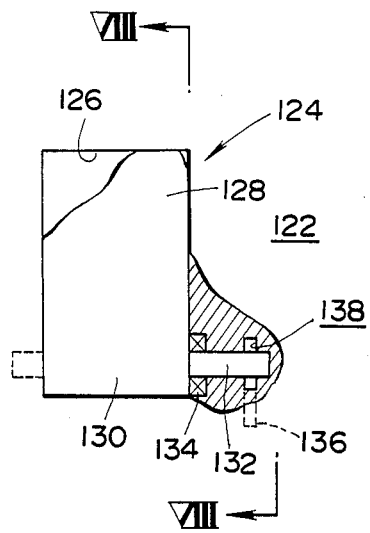
FIG. 7 is an enlarged plan view of the stopper in FIG. 4.
Figure 8:
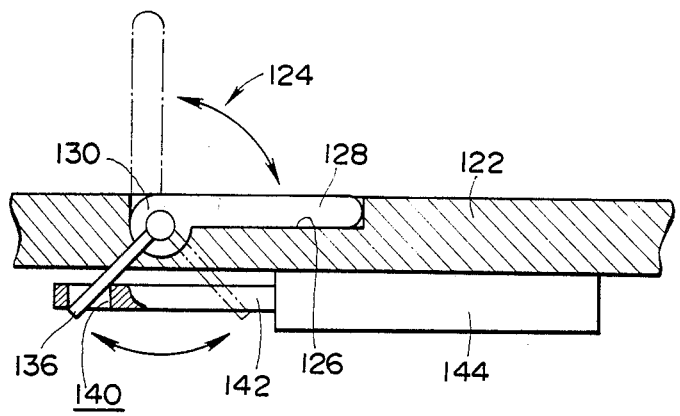
FIG. 8 is a view taken along the line VIII—VIII in FIG. 7.
Figure 9:
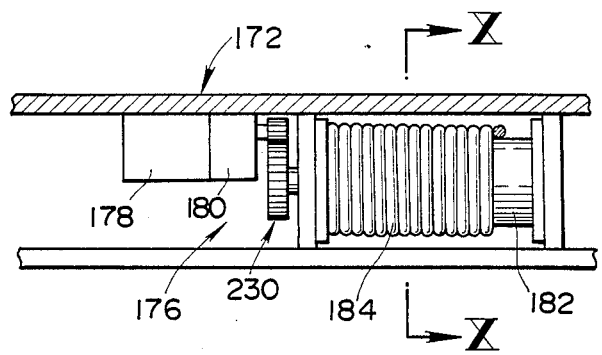
FIG. 9 is an enlarged vertical section of part of the lifting chamber in FIG. 4.
Figure 10:
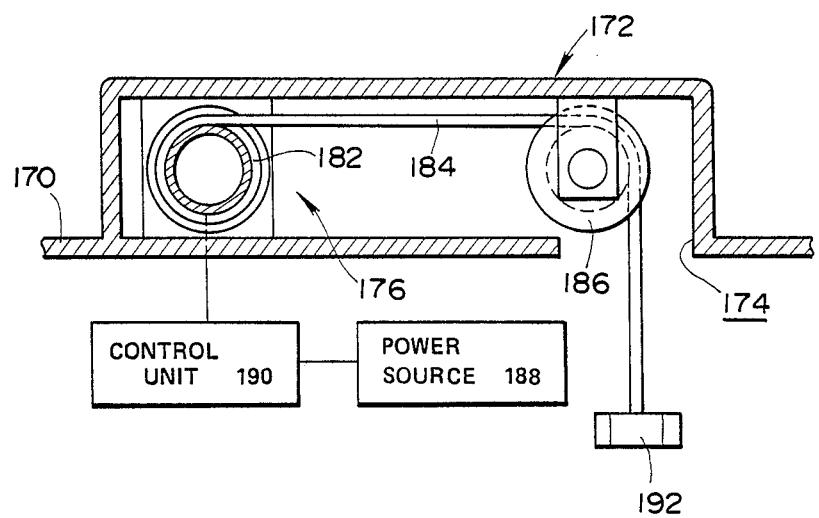
FIG. 10 is a view taken along the line X—X in FIG. 9.
Figure 11:
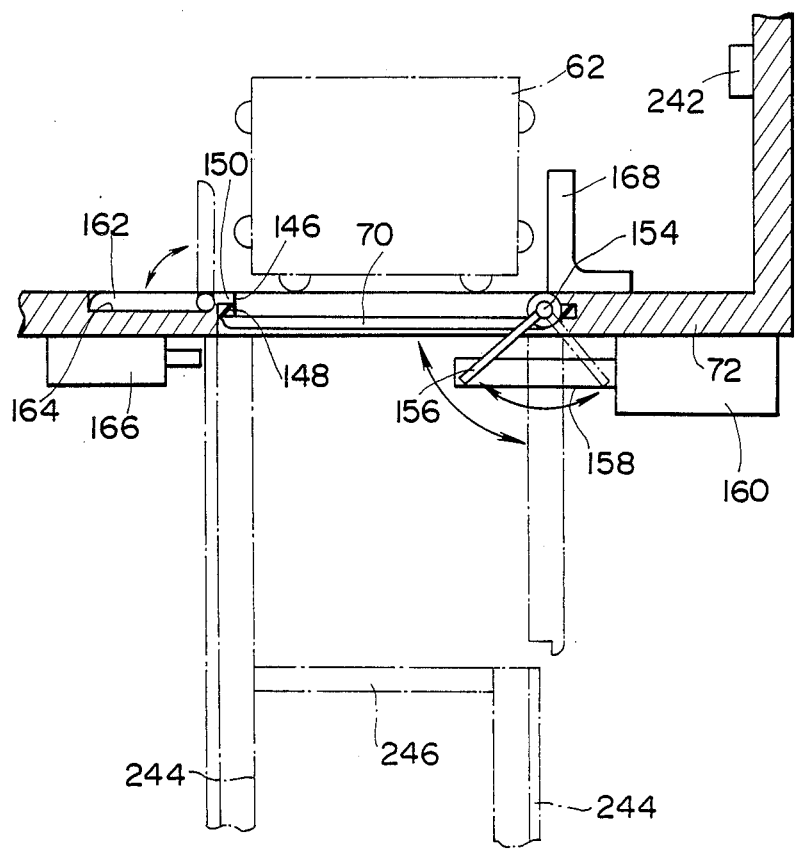
FIG. 11 is an enlarged vertical section of part of the station tube in FIG. 4.

As shown in FIG. 5, the proximal end 84 of each of the loading and unloading station tubes 66A–66D and 68A–68D is communicated to the transfer tube 58 through a rectangular opening 80 formed through one side wall 82 of the transfer tube 58. The loading and unloading station tubes 66 and 68 are each provided near proximal ends 84 thereof with a square door plate 88 for sealingly closing the proximal ends. The door plate 88 includes a closure plate portion 90 and a shaft portion 92 integrally formed with the upper edge of the closure plate portion 90 to be parallel with that upper edge. The inner face of the upper wall 96 of each of station tubes 66A–66D and 68A–68D has a substantially semicircular groove 94 formed crosswise in it near its proximal end 84. The shaft portion 92 of the door plate 88 is fitted in the groove 94 and rotatably supported on opposite side walls 98 and 100 of each of the station tubes 66A–66D and 68A–68D. One journal 102 is concentrically threaded to each shaft portion 92 and passes through one side wall 100 as illustrated in FIG. 6. The journal 102 is hermetically sealed with a sealing ring 106 fitted around it and has an arm 104 projecting radially outwardly from its outer end. The arm 104 slidably passes through a through slot formed through a plunger 108 of a solenoid 110 for turning the shaft portion 92. Each of station tubes 66A–66D and 68A–68D has an annular groove 112 formed in its inner faces to be perpendicular to its axis 114, the annular groove 112 communicating to the semicircular groove 94. An annular seal 116 is bonded to the walls of each annular groove 112. The shaft portion 92 of each door plate 88 hermetically contacts an upper horizontal portion 118 of the annular seal 116 and the periphery of the closure plate portion 90 is normally brought into hermetical contact with the other portions of the annular seal 116 since the plunger 108 of the solenoid 110 is spring biased to a retracted position to place the arm 104 in a position shown by the solid line in FIG. 5. A conventional photodetector 120 is provided to the transfer tube 58 upstream of each of its openings 80 for detecting a vehicle 62 passing through the transfer tube 58. Mounted on the inner face of the bottom wall 122 near each opening 80 is a pair of stoppers 124 which face each other when they stand although only right stopper 124 is in a stand position in FIG. 4. Each stopper 124 is normally received in a recess 126, which is formed in the bottom wall 122 of the transfer tube 58 as shown in FIGS. 7 and 8, and includes a support portion 130, rotatably supported on the opposite walls of the recess 126, and a rectangular stopping plate 128 integrally formed at its proximal end with the supporting portion 130. One journal 132 of the supporting portion 130 is sealingly supported with a sealing ring 134 fitted around it and has an arm 136 radially outwardly projecting from its distal end. This arm 136 slidably passes to the outside of the transfer tube 58 through a slot 138 formed in the outer face of the bottom wall 122. The arm 136 slidably passes through a slot 140 formed through a plunger 142 of a solenoid 144. The plunger 142 is spring biased to a position shown by the solid line in FIG. 8 for placing the stopping plate 128 within the recess 126. When the solenoid 144 is actuated, the plunger 142 is retracted to place the stopping plate 128 in a stand position shown by the dot-and-dash line in FIG. 8. As illustrated in FIG. 11, each of station tubes 66A-66D and 68A-68D has a square bottom opening 146 formed through its bottom wall 72. Each closure plate 70 has a shape similar to the door plate 88 and is attached to walls of the opening 146 of the bottom wall 72 in a similar manner as in that door plate. The closure plate 70 hermetically closes the bottom opening 146 with an annular seal 148 which is bonded to an annular shoulder 150 of the bottom opening 146. One journal 154 of the closure plate 70 sealing passes through the bottom plate 72 to the outside and an arm 156 of the journal 154 is slidably fitted in a slot (not shown) which is formed in a plunger 158 of a solenoid 160. The solenoid 160 is mounted on the lower face of the bottom wall 72. The closure plate 70 is normally urged against the seal 148 by the spring biasing of the plunger 158 as shown by the solid line in FIG. 11 but it is turned downward to a position shown by the dot-and-dash line when the solenoid 160 is actuated. In the same manner as the stopper 124, a stopper 162 is mounted on the bottom plate 72 of each station tube 66A-66D, 68A-68D just in front of the bottom opening 146. The stoppers 162 have the same shape and structure as stoppers 124 and are normally received in recesses 164 and turned to a stand position, illustrated by the dot-and-dash line in FIG. 11, in the same manner as the stoppers 124 when a solenoid 166 is actuated. On the rear side of each bottom opening 146, a stopping wall 168 is erected on the bottom wall 72 to face the stopper 162 in the stand position. As shown in FIGS. 4, 9 and 10, each station tube 66A-66D, 68A-68D is provided on its upper wall 170 with a lifting chamber 172 which communicated to the interior of the station tube through a communication hole 174. In each lifting chamber 172 there is furnished with a lifting mechanism 176 which includes an electric motor 178, a speed reducer 180 connected to the motor 178, a winding drum 182 rotatably mounted on the chamber 172 for winding an electric code 184, as a lifting rope, around it and a pulley 186 rotatably mounted on the ceiling of the chamber 172 and engaging the code 184. One end of the electric code 184 is attached to the winding drum 182 and electrically connected to an electric source 188 (FIG. 10) through an conventional electric control unit 190 and the other end is connected to an electromagnet 192 for holding vehicles 62 by electromagnetic attraction.

Figure 12:
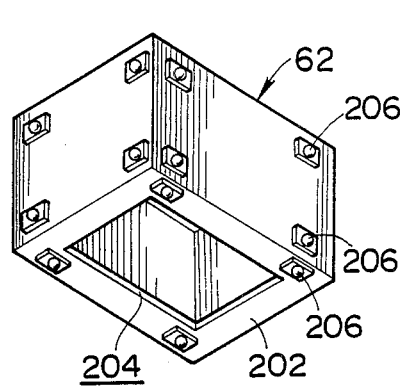
FIG. 12 is an enlarged perspective view, seen from the bottom, of the vehicle in FIG. 4.

FIGS. 12 and 13 illustrate details of each vehicle 62, which has a hollow rectilinear box shape and has an open upper end 200 and a bottom wall 202 having a rectangular bottom opening 204. Each wall defining the vehicle 62 has four conventional ball rollers 206, . . . , rotatably mounted on its outer face for making rolling contact with inner faces of walls of both the transfer tube 58 and station tubes 66A-66D, 68A-68D. Each pod 40 is carried on a vehicle 62 by holding a bottom flange 47 of its box 46 in the bottom opening 204 by means of four holding devices 214 (only two of which are shown). Each holding device 214 includes an inverted L-shaped supporting member 216, having its one leg erected on the inner periphery of the bottom wall 202, and a wedge member 218 connected through a coil spring 220 to the other leg of the supporting member 216. The walls 222 which define the bottom opening 204 are inclined with respect to the horizontal line to guide wedge members 218. The pod 40 is held to the vehicle 62 by frictionally engaging outer faces 213 of the bottom flange 47 with the wedge members 218 as shown in FIG. 13(A). This is manually performed.

Figure 13A:
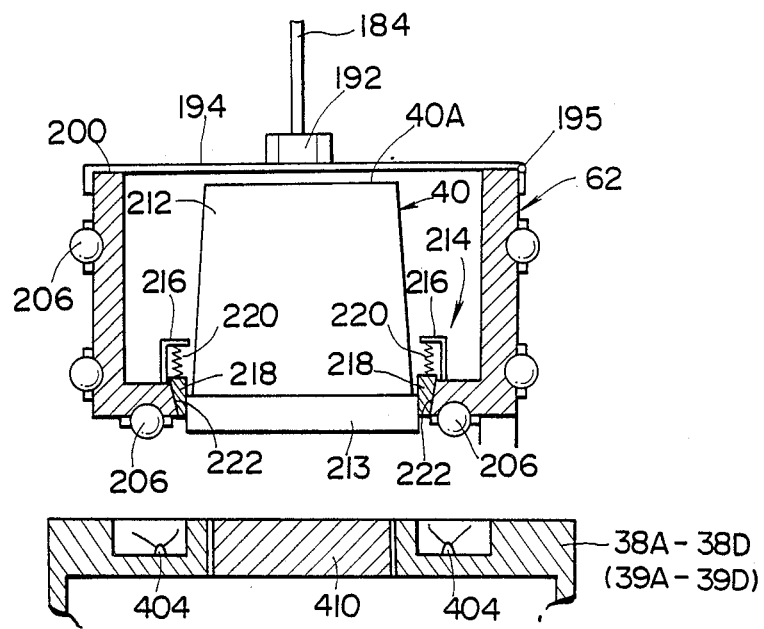
FIG. 13(A) is an enlarged, sectional side view of the vehicle in FIG. 12 on which the pod rides, the vehicle being lifted.
Figure 13B:
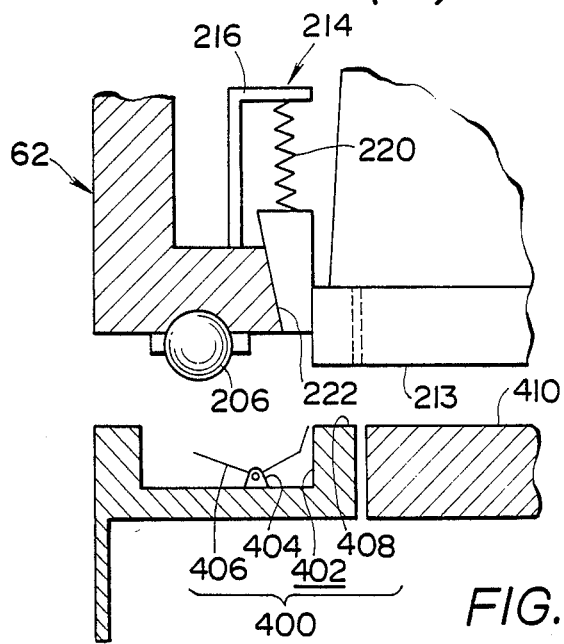
FIG. 13(B) is an enlarged fragmentary view, partly in section, of the vehicle in FIG. 13(A), in which the vehicle is being placed on an ARM.
Figure 13C:
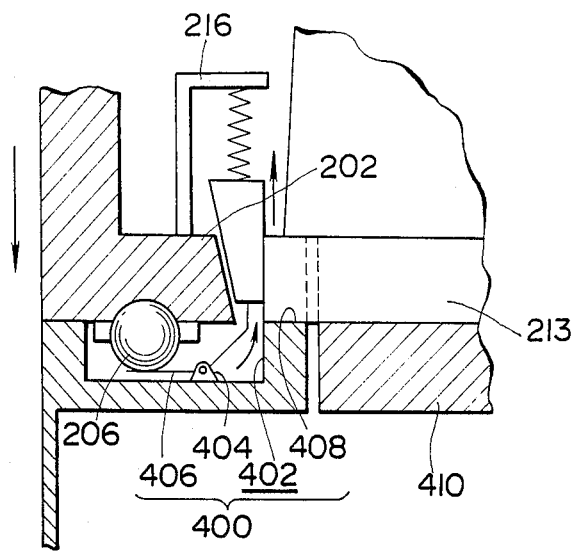
FIG. 13(C) is an enlarged fragmentary view, partly in section, of the vehicle in FIG. 13(A), in which the vehicle is placed on the ARM.
Figure 13D:
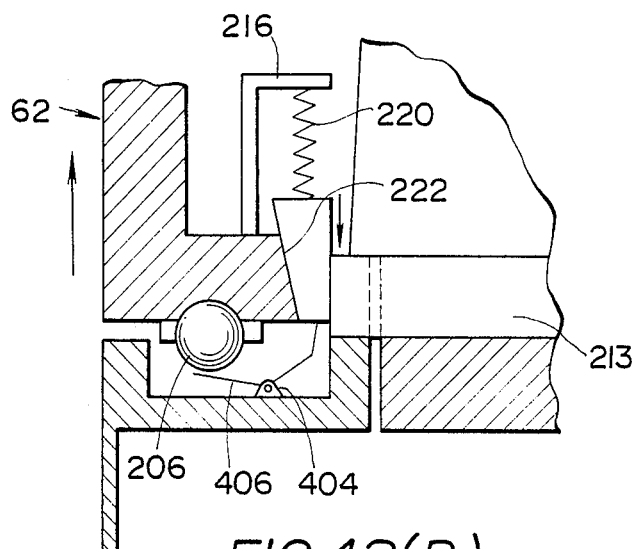
FIG. 13(D) is an enlarged fragmentary view, partly in section, of the vehicle in FIG. 13(A), in which the vehicle is about to disengage from the two-arms lever.

As illustrated in FIG. 13(A), an attraction plate 194 made of a steel is mounted at its one end to the open end 200 of one side wall of the vehicle 62 by means of a hinge 195 so that it may turn about the hinge 195. The other end of the attraction plate 194 is detachably attached to the open end 200 of the opposite side wall of the vehicle 62 by means of a conventional latch and catch mechamism (not shown). The attraction plate 194 is arranged so that it comes into contact with the electromagnet 192 in lifting the vehicle 62.

Each ARM 38A-D, 39A-D has four recesses 402 formed in the periphery of its top face although only two recesses are shown in FIG. 13(A). A two-arms lever 406 is pivotally mounted through a bracket 404 to the bottom wall of each recess 402.

In operation, a vehicle 62A (FIG. 4) which is carrying a pod 40 is introduced into the transfer tube 58 through the inlet door 59 and then the inlet door 59 is closed. The first blower 54 is actuated to evacuate the transfer tube 58, thus providing a negative pressure in front of the vehicle 62A for moving the latter forwards. When the vehicle 62A passes through the detector 120 disposed near the first unloading station tube 66A for the first semiconductor processing apparatus 50A, the detector 120 provides an electric signal to the control unit for deactivating the first blower 54 to decelerate the vehicle 62A and for actuating the solenoid 144 of the stopper 124 disposed in front of the first unloading station tube 66A, thus placing the stopping plate 128 in the stand position shown by the dot-and-dash line in FIG. 8. The vehicle 62A is thus stopped by the stopping plate 128 to be positioned just in front of the door plate 88 of the first unloading station tube 66A. Then, the other stopper 125 is similarly raised for slidably holding the vehicle 62A against the stopper 124. Thereafter, the first blower 54 is actuated again and the solenoid valve 78 of the first unloading station tube 66A is opened for evacuating it. Then, the solenoid valve 110 of the door plate 88 of the first unloading station tube 66A is actuated for turning the closure plate portion 90 to the open position shown by the dot-and-dash line in FIG. 5 and the vehicle 62A is thereby forced to move into the first unloading station tube 66A due to the difference in pressure between its opposite lateral sides. The vehicle 62A is stopped by the stopping wall 168 near the closed end of the first station tube 66A and then the stopper 162 is raised to the position shown by the dot-and-dash line in FIG. 11 by actuating the solenoid 166 for positioning the vehicle 62A on the closure plate 70. After these operations, the first blower 54 is deactivated and the electric motor 178 of the lifting mechanism 176 is energized for rotating the winding drum 182 through the speed reducer 180, and a gear train 230 interconnecting the speed reducer 180 to a shaft of the drum 182. The code 184 is thus unwound to descend the electromagnet 192 for electromagnetically holding the steel plate 194 of the pod 40 of the first vehicle 62A as illustrated in FIG. 13. After this, the solenoid 160 of the closure plate 70 is actuated to turn the closure plate 70 to the position shown by the dot-and-dash line in FIG. 11 and the vehicle 62A is then gradually descended together with the pod 40 since they are connected together through the wedge members 218. When the vehicle 62A is coming into contact with the top face of the first loading ARM 38A, each ball roller 206 on the bottom wall 202 of the vehicle 62 impinges upon the free end of the outer arm of a corresponding lever 406 and forces the lever 406 to turn counterclockwise in FIG. 3(C), so that the free end of the inner arm impinges upon the corresponding wedge member 218 to move the latter upwards relative to the bottom wall 202 against the spring 220. Thus, the pod 40 is disengaged from the vehicle 62 and the bottom flange 47 of its box 46 is placed on the inner periphery 408 of the top face of the ARM 38A of the first semiconductor processing apparatus 50A. The lever 406, bracket 404, recess 402 and inner periphery 408 of the top face of the ARM 38A constitute a pod disengaging mechanism 400. The box door 42 is suppoted on an elevating plate 410 and then conventionally separated from the box 46 with a wafer cassette 44 placed on it and then introduced into the semiconductor processing apparatus 50A, where wafers 48 are removed from the wafer cassette 44 and then processed. During this processing, another vehicle 62B is introduced into the transfer tube 58 through the entrance door 59, the vehicle 62B carrying an empty wafer cassette 44. In the same manner, the vehicle 62B is then transferred into the first unloading station 68A, from which the vehicle 62B is lowered to the first unloading ARM 39A, which transfers the empty wafer cassette to the unloading side of the first semiconductor processing apparatus 50A. Thereafter, the wafers 48 processed are sequentially transferred into the wafer cassette 44 located on the unloading side and this wafer cassette 44 is then transferred to the unloading ARM 39A for placing it on the box door 42, which is then returned and engaged with the box 46, placed on the top of the unloading ARM 39A, by elevating the elevating plate 410 (FIG. 13(C)). Then, vehicle 62 is lifted by energizing both the electric motor 178 and the electromagnet 192 of the lifting mechanism 176 of the first unloading station tube 68A, so that the wedges 218 depresses the inner arm of the two-arm lever 406 with the force exerted by the spring 220. Thus, each wedge 218 is brought into engagement with both the outer face 213 of the bottom flange 46 and the corresponding inclined wall 222 of the vehicle 62B, with the result that the pod 40 is frictionally held to the vehicle 62B (FIG. 13(D)). Then, the vehicle 62B is lifted together with the pod 40 (FIG. 13(A)). When the vehicle 62B is lifted to the position shown by the dot-and-dash line in FIG. 11, the photosensor 242 detects the vehicle 62B and provides a signal to the control unit, which thus deactivates the solenoid 160, with the result that the plunger 158 is projected by the spring force for returning the closure plate 70 to the position shown by the solid line in FIG. 11 so as to sealingly close the bottom opening 146. Then, the electromagnet 192 is deenergized and the vehicle 62B is thus supported on the closure plate 70.

Thereafter, the first blower 54 is actuated for evacuating the transfer tube 58 again and vehicle 62B is thereby forced to move toward the opening of the unloading station tube 68A since the door plate 88 is left open and it is then moved to the second loading station tube 66B for the second semiconductor processing apparatus 50B in the same manner as the vehicle 62A is moved to the first loading station tube 66A. When the second vehicle 62B is placed on the closure plate 70 of the second loading station tube 66B, the door plate 88 is closed. Then, the wafer cassette 44 transferred by the vehicle 62B is introduced into the second semiconductor processing apparatus 50B in the same manner as in the first semiconductor processing apparatus 50A.

During the processing of the last wafer in the first semiconductor processing apparatus 50A, the empty wafer cassette 44 on the loading side is returned within the pod 40 on the first ARM 38A and in the same manner as in the second vehicle 62B, the pod 40 is then returned to the first loading station 66A together with the first vehicle 62A, which is then forced to move into the second unloading station tube 68B for introducing the empty wafter cassette 44 into the second semiconductor apparatus 50B.

By repeating sequentially the above procedures in connection with the second, third and fourth semiconductor processing apparatuses 50B, 50C and 50D, predetermined processing is made to the wafers 48. The finished semiconductor products are loaded to the empty wafer cassette 44 in the fourth semiconductor processing apparatus 50D and then transferred into the pod 40 on the fourth unloading ARM (not shown) and then, this pod 40 similarly rides on the first vehicle 62A, which is transferred to the fourth unloading station tube 66D. From this station tube 66D, the first vehicle 62A is transferred to a position in front of the outlet door 61 by actuating the first blower 54. Similarly, the empty wafer cassette 44 in the fourth semiconductor processing apparatus 50D is returned into the pod 40 on the fourth loading ARM (not shown) and then this pod 40 rides on the second vehicle 62B, which is then returned to the fourth loading station tube 66D, from which it is transferred in front of the first unloading station tube 68A by actuating the second blower 56. Then, the second vehicle 62B is returned to the first unloading ARM 39A, from which the empty wafer cassette 44 is reintroduced into the first semiconductor processing apparatus 50A.

Figure 14:
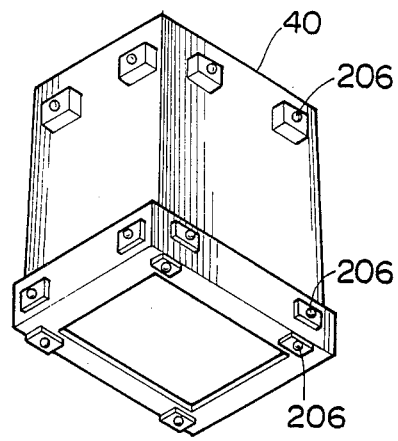
FIG. 14 is a perspective view, seen from the bottom, of a modified form of the pod in FIG. 13.

For transferring each pod 40, ball rollers 206 may be directly mounted on it as illustrated in FIG. 14. In this case, the vehicles 62A and 62B are not used.

Figure 16:
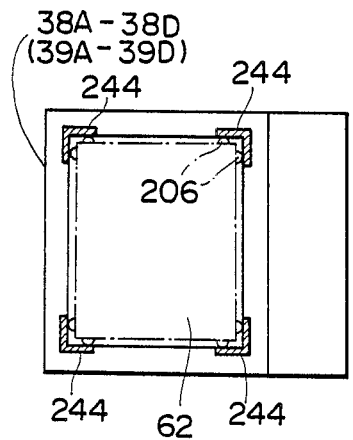
FIG. 16 is an enlarged view taken along the line XVI—XVI in FIG. 15.
Figure 15:
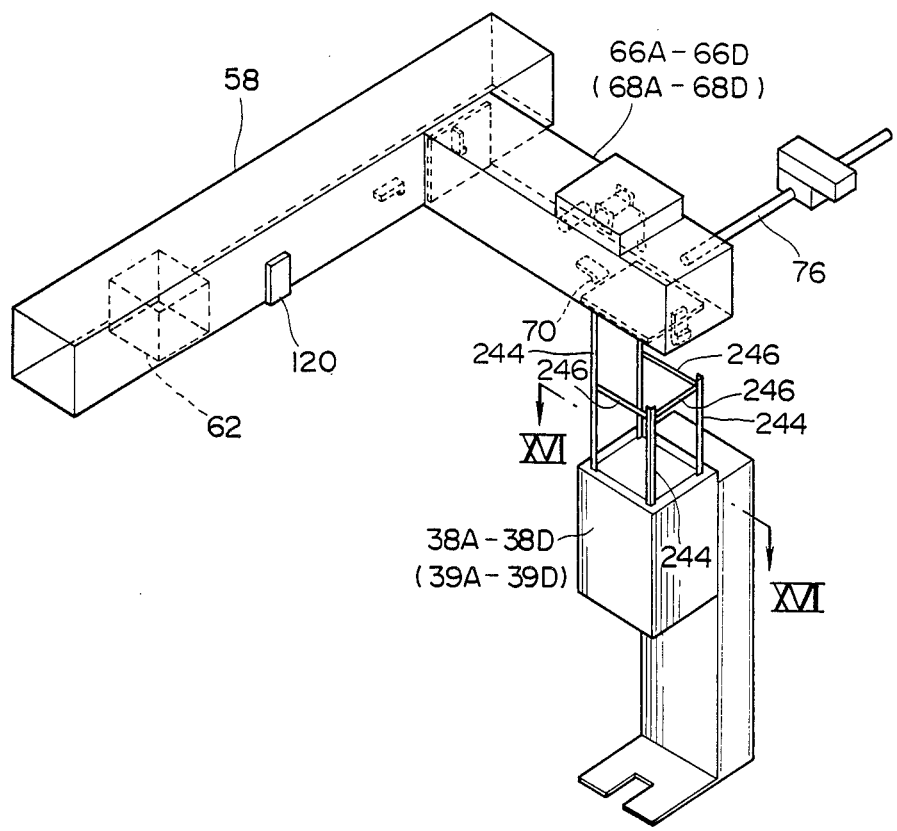
FIG. 15 is a perspective view of a modified form of the lifting mechanism in FIG. 4.

As shown in FIGS. 15 and 16, four parallel angle rails 244 may be erected on the top face of each ARM 38, 39 for smoothly guiding vehicles 62 to position on the ARM 38 or to the bottom opening 146 (FIG. 11) of the corresponding station tube 66A-66D, 68A-68D. Two of the angle rails 244 are, as illustrated by the dot-and-dash line in FIG. 11, attached at their upper ends to peripheries of corners of the bottom opening 146, the corners being remote from the journals 154. The other two angle rails 244 have a height such that their upper ends are located just below the free end of the closure plate 70 when the latter is opened, the upper ends being jointed to adjacent angle rails 244 with connecting rods 246. When guided, each vehicle 62 has balls of the its ball rollers 206 brought into rolling contact with inside faces of the guide rails 244 as illustrated in FIG. 16, the ball rollers 206 being mounted on its lateral sides.

Figure 17:
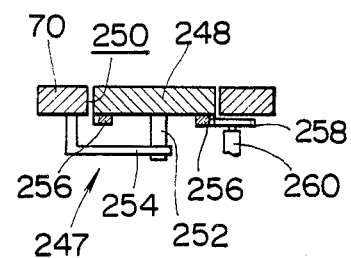
FIG. 17 is a vertical section of a modified form of the closure plate in FIG. 11, having a turning mechanism.

As illustrated in FIG. 17, each closure plate 70 may be provided with a turning mechanism 246 for horizontally turning a vehicle 62 placed on it. The turning mechanism 246 includes a circular turning table 248 fitted in a circular opening 250 formed through the closure plate 70. The turning table 248 has a rotation shaft 250 coaxially mounted on it. The rotation shaft 252 is supported on a bracket 254, mounted on the closure plate 70, so that it is rotatably about its axis. The turning table 248 has an external gear 256 coaxially mounted on its lower face. A pinion 258, which is mounted on an output shaft of a step motor 260, is meshed with the external gear 256, the step motor 260 being mounted on the closure plate 70. With such a construction, the control unit may energize the step motor 260 for rotating the turning table 248 a predetermined angle through the pinion 258 and the external gear 256. Thus, each vehicle 62 placed on the closure plate 70 may appropriately set its horizontal direction for matching the pod 40 in direction to semiconductor processing apparatuses 50A-50D.

Figure 19:
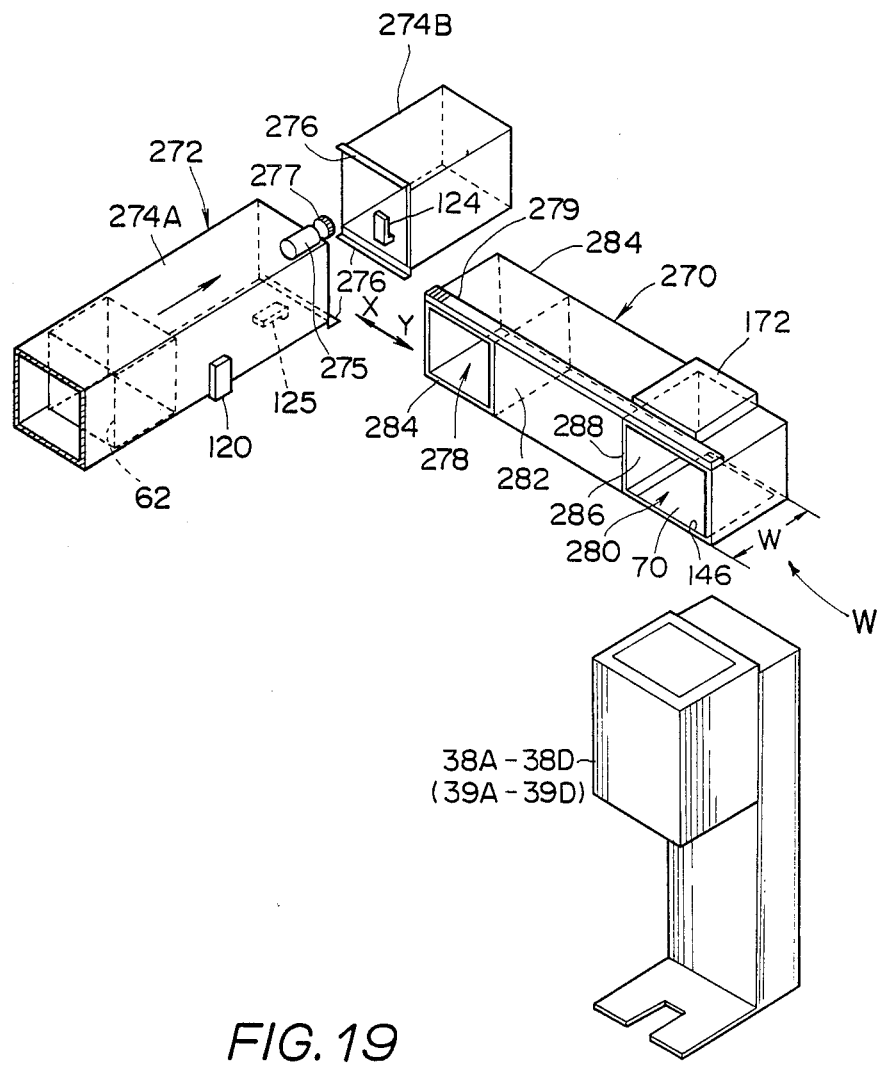
FIG. 19 is an enlarged, exploded view of one station tube in FIG. 18.
Figure 20:
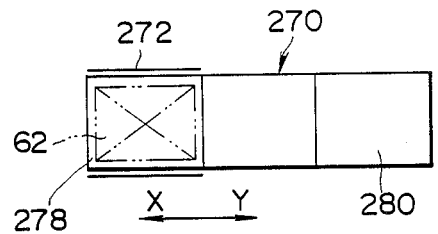
FIG. 20 is a diagrammatic side view of the station tube in FIG. 19 when the communicating portion of the station tube is in communication with the transfer tube.
Figure 21:
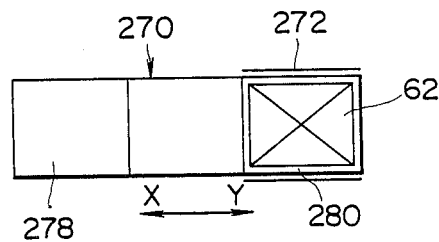
FIG. 21 is a diagrammatic side view of the station tube in FIG. 19 when the conveying portion thereof is in communication with the transfer tube.
Figure 22:
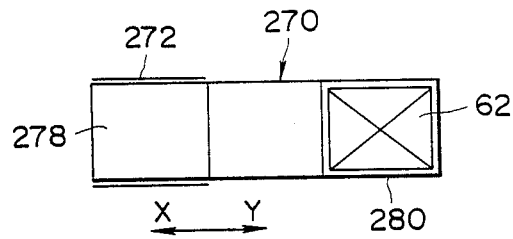
FIG. 22 is a diagrammatical side view of the station tube in FIG. 19 when the communication portion is in communication with the transfer tube again with the vehicle received within the conveying portion.

FIGS. 18 and 19 illustrate another embodiment of the present invention, in which each of loading and unloading station tubes 270, having closed opposite ends, is mounted to the transfer tube 272 to be slidable perpendicularly to the axis of the latter, i.e., in the direction X-Y. In this embodiment, the transfer tube 272 includes nine tube pieces 274A-274H aligned with a spacing substantially equal to the width W of station tubes 270. Each station tube 270 is slidably supported on a pair of guide flanges 276 and 276 mounted to lower edges of opposing ends of two adjacent tube pieces 274A and 274B and on another guide flange 276 mounted to the upper edge of one of the two adjacent tube pieces. The flanges 276 extend along the edges. A drive unit 275 including an electric motor is mounted on a top wall of the other tube piece 274A, . . . , near its upper edge and a pinion 277 is mounted on the output shaft of the drive unit 275. The pinion 277 meshes with a rack 279 mounted on the top wall of the station tube 270 in the X-Y direction for moving that station tube. Each station tube 270 has a communicating portion 278 formed at its one end and a conveying portion 280 formed at the other end. The communicating portion 278 is partitioned with a partition wall 282 from the other portion of the station tube 270 and its opposite lateral sides are opened to have rectangular openings 284 for allowing vehicles 62 to pass through it. Each conveying portion 280 is partitioned with a partition wall 286 from the other portion of the station tube 270 and has closure plate 70 for closing its bottom opening 146 as in the station tubes 66A-66D and 68A-68D. The opposite lateral sides of the conveying portion 280 are opened to form openings 288 for allowing vehicles 62 to enter into and exit from it. When the station tube 270 is located at a position diagrammatically shown in FIG. 20, the communicating portion 278 communicates to two adjacent transfer tube pieces 274A and 274B, . . . through its opposite openings 284 and 284. Thus, a vehicle 62 which moves within the transfer tube piece 272A, . . . may pass through the communicating portion 278 into the adjacent tube piece 272B, . . . In transferring a vehicle 62 to an ARM 38, 39 disposed below this station tube 270, the drive unit 275 is actuated to move the station tube 270 by the rack-and-pinion mechanism in the X direction to another position illustrated in FIG. 21, in which the conveying portion 280 is communicated through the openings 288 to the tube pieces 274A and 274B. After the vehicle 62 is stopped within the conveying portion 280 by the stoppers 124 and 125 in the same manner as in the first embodiment, the station tube 270 is returned back to the original position illustrated in FIG. 22 by moving it in the direction Y. At this position, the conveying portion 280 is positioned just above the ARM 38, 29 for transferring the vehicle 62, placed on the closure plate 70, to the ARM 38, 39 in the same manner as in the first embodiment. For returning the vehicle 62 to the transfer tube 272, the station tube 270 at the position in FIG. 22 is moved in the direction X to the position in FIG. 20, from which the vehicle 62 is forced to move into the tube piece 274B by actuating the first blower 54. In this embodiment, detection of the position of the station tubes 270 is made by means of photodetectors (not shown).

Figure 23:
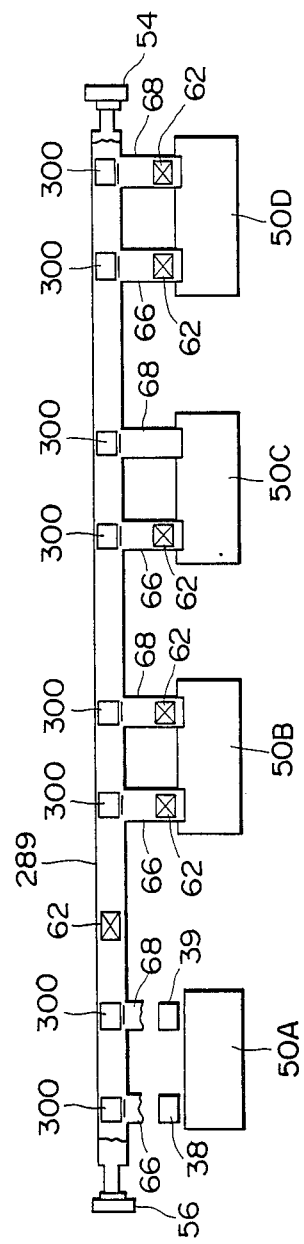
FIG. 23 is a diagrammatic plan view, partly in section, of a third embodiment of the present invention with the first loading and unloading station tubes partly broken away.
Figure 24:
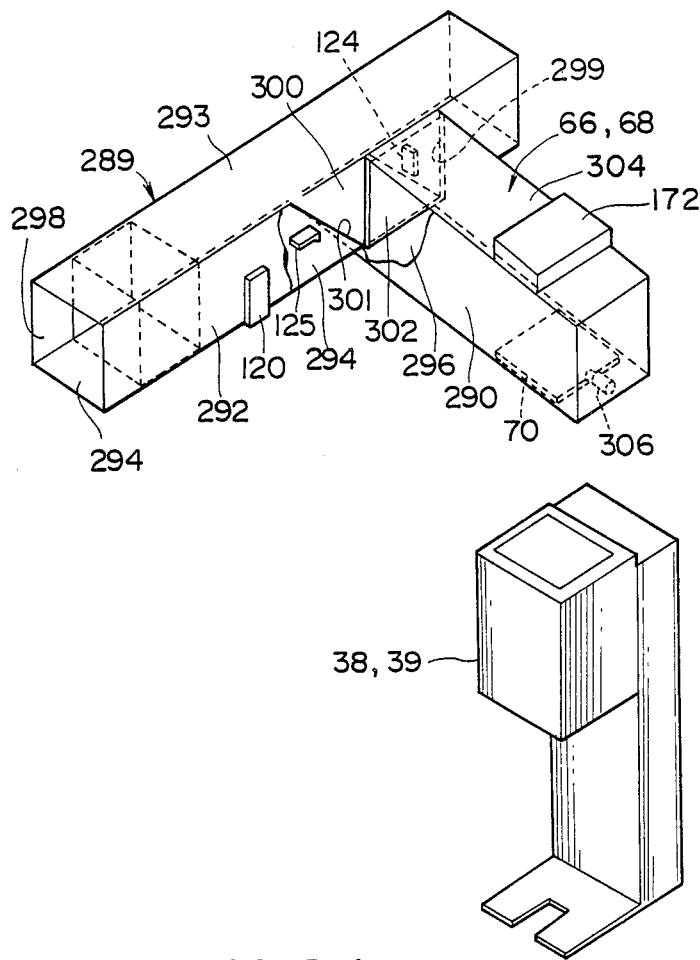
FIG. 24 is an enlarged perspective view, partly in section, of part of the transfer tube in FIG. 23 in which the bottom and the lateral partition plates are placed in closed positions.

A third embodiment of the present invention is illustrated in FIGS. 23 and 24, in which each of station tubes 66, 68 is fixed at its proximal portion to the transfer tube 289 so that it is inclined downwards. One lateral wall 292 and the bottom wall 294 of the transfer tube 289 respectively have rectangular lateral opening 299 and bottom opening 301, both the openings formed at portions surrounded with the fixed ends of the station tubes 66, 68. The opposite lateral walls 290 and 290 of each station tube 66, 68 are welded at their proximal ends to both the one lateral wall 292 and the bottom wall 294 of the transfer tube 272. The upper wall 304 and the bottom wall 296 of the station tube 66, 68 are welded at their proximal ends to the upper edge of the one lateral wall 292 and the lower edge of the other side wall 298 respectively. Thus, a double bottom is formed at the proximal end of the bottom wall 296 in combination with the proximal portion of the bottom wall 294 of the transfer tube 289. A rectangular swingable bottom plate 300 is fitted in the opening 301 to form a double bottom wall together with the proximal portion of the bottom plate 296. One lateral edge of the bottom plate 300 is connected to the lower edge portion of the side wall 298 to be pivotable about a horizontal axis. The bottom plate 300 is pivoted by a solenoid (not shown) in the same manner as in the closure plate 70. It is normally placed in a horizontal position shown in FIGS. 24 and 25 by spring biasing the plunger of the solenoid and is swung to an inclined position shown in FIG. 26 by actuating the solenoid. When the bottom plate 300 is placed in the horizontal position, it is flush with the bottom wall 294 of the transfer tube 289. The one lateral wall 292 has a rectangular partition plate 302 designed to normally fit into the lateral opening 299. The partition plate 302 is supported at its upper edge on the proximal end of the upper plate 304 for swinging about a horizontal axis as in the door plate 88. The partition plate 302 is swung by actuating a solenoid (not shown) to an upper limit position shown in FIG. 26 and is normally placed at a vertical position in FIGS. 24 and 25. The pivoting mechanism of the partition plate 302 is similar to that of the door plate 88 and description thereof is omitted.

Figure 25:
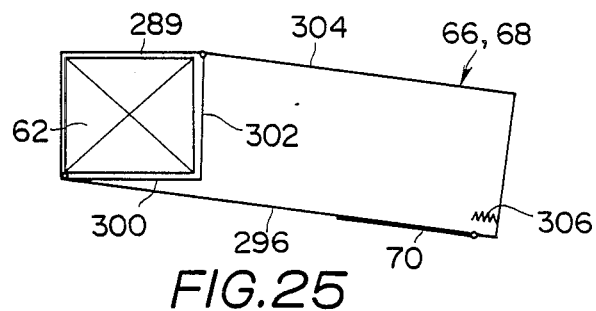
FIG. 25 is a diagrammatic vertical sectional view of each station tube in FIG. 24.
Figure 26:
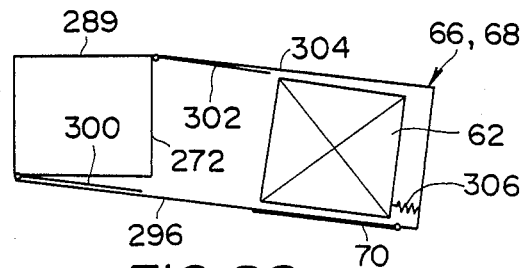
FIG. 26 is a diagrammatic vertical sectional view of the station tube in FIG. 24, in which the bottom and the lateral partition plates are placed in open positions with the vehicle sliding on the bottom thereof.
Figure 27:
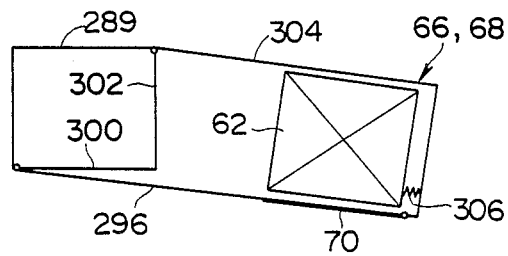
FIG. 27 is a diagrammatical vertical sectional view of the station tube in FIG. 24, in which the bottom and the lateral partition plates are returned to the closed positions with the vehicle placed on the closure plate.

For introducing a vehicle 62 into each of the station tubes 66, 68, it is stopped by the stoppers 124 and 125 in front of the partition plate 302 as illustrated in FIG. 25. Then, the bottom plate 300 and the partition plate 302 are swung as stated above to the respective positions shown in FIG. 26, so that the vehicle 62 slides down on the bottom wall 296 of the station tube 66, 68 until it impinges upon a spring coil damper 306, which absorbs the impact energy. Thus, the vehicle 62 is placed on the closure plate 70 as in FIG. 27, without applying any considerable impact to wafers carried by the vehicle 62.

Figure 28:
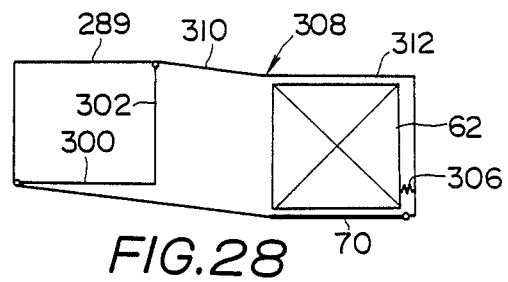
FIG. 28 is a diagrammatic vertical section of a modified form of the station tube in FIG. 24.

FIG. 28 illustrates a modified form of the station tube 66, 68 in FIG. 24. This modified station tube 308 includes a downwards inclined proximal portion 310, jointed to the transfer tube 272, and a horizontal distal portion 312 integrally and continuously formed with the free end of the proximal portion 310. With such a construction, wafers carried by the vehicle 62 is subjected to less impact than in the vehicle 62 in FIG. 27 when the vehicle 62 is positioned on the closure plate 70.

While the invention has been disclosed in specific detail for purposes of clarity and complete disclosure, the appended claims are intended to include within their meaning all modifications and changes that come within the true scope of the invention.

What is claimed is:

1. A transfer system for transferring a pod in a clean room, in which the pod is adapted to contain a wafer cassette, comprising:
    at least one pair of ARMs, disposed adjacent to a semiconductor processing apparatus for transferring wafers, loaded in the wafer cassette, into and out of the semiconductor processing apparatus;
    a transfer tube disposed near the ARMs;
    a vehicle adapted to carry the pod and adapted to move within the transfer tube;
    evacuation means for evacuating the transfer tube to produce a negative pressure within the transfer tube so that the vehicle is moved along an axis of the transfer tube due to the negative pressure; and
    at least one pair of conveying means for conveying the vehicle between the transfer tube and respective ARM's, each conveying means includes: a first tubular station member having a bottom wall, jointed at one end thereof to the transfer tube for communication with the transfer tube and closed at the other end, the first station member extending substantially horizontally to a position near a corresponding ARM; delivering means for delivering the vehicle between the first station member and the corresponding ARM; and communicating means for communicating the first station member to the evacuation means to produce another negative pressure within the first station member for moving the vehicle within the first station member from the transfer tube to the delivering means, wherein the transfer tube includes stopping means for stopping the vehicle within the transfer tube in front of the one end of the first station member for introducing the vehicle into the first station member, and
    the first station member includes a bottom closure means, mounted to the bottom wall at the other end thereof, for allowing the vehicle to enter into and exit from the first station member, wherein the corresponding ARM is located just below the bottom closure means, and wherein the delivering means comprises vertically moving the vehicle between the first station member and the corresponding ARM through the bottom closure means.

2. A transfer system as recited in claim 1, wherein the transfer tube comprises a plurality of tube pieces concentrically aligned in an equi-spaced manner, wherein each conveying means comprises: a second station member, mounted to two adjacent tube pieces so that the second station member is slidable perpendicularly to an axis of the two adjacent tube pieces between a first position and a second position and occupies the space between the two adjacent tube pieces; delivering means for delivering the vehicle between the second station member and a corresponding ARM; and moving means for moving the second station member between the first position and the second position, and wherein the second station member comprises: a communicating portion formed at one end thereof, the communicating portion being adapted to communicate the two adjacent tube pieces to each other for allowing the vehicle to pass through the communicating portion when the second station member is in the first position; and a conveying portion formed at the other end thereof and having a bottom wall, the conveying portion being adapted to communicate to the two adjacent tube pieces for allowing the vehicle to enter into and exit from the conveying portion when the second station member is in the second position, the delivering means being adapted to deliver the vehicle between the conveying portion and the corresponding ARM when the second station member is in the first position.

3. A transfer system as recited in claim 2, wherein two adjacent tube pieces comprise stopping means for stopping and positioning the vehicle within the communicating portion of the second station member.

4. A transfer system as recited in claim 3, wherein the second station member comprises a bottom closure means, mounted to the bottom wall of the conveying portion, for allowing the vehicle to enter into and exit from the second station member, wherein the corresponding ARM is located just below the bottom closure means, and wherein the delivering means comprises vertically moving means for vertically moving the vehicle between the second station member and the corresponding ARM through the bottom closure means.

5. A transfer system as recited in claim 1, wherein the transfer tube has a rectangular tube shape and comprises a top wall, opposed lateral walls and a bottom wall, wherein each conveying means comprises: a third station member having a rectangular tubular shape, the third station member having one end open and jointed to the transfer tube so that the third station member is inclined downwards for moving the vehicle by gravity within the third station member toward the other end thereof, the other end having a bottom wall and being closed; and delivering means for delivering the vehicle between the third station member and a corresponding ARM, and wherein the transfer tube comprises partitioning means for partitioning the interior thereof from the third station member and for allowing the vehicle to move between the transfer tube and the third station member, the partitioning means including a lateral partition plate member having an upper edge, and vertically swingable about the upper edge between a first closed position, in which the lateral partition plate member defines part of one lateral wall facing to the third station member, and a first open position substantially parallel to an axis of the third station member, and a bottom partition plate member having one lateral edge adjacent to the other lateral wall of the transfer tube, vertically swingable about the one lateral edge between a second closed position, in which the bottom partition plate member defines part of the bottom wall of the transfer tube, and a second open position substantially parallel to the axis of the third station member, whereby the vehicle is allowed to pass the partition means when the lateral partition plate member and the bottom partition plate member are in respective open positions.

6. A transfer system as recited in claim 5, wherein the transfer tube comprises stopping means mounted thereto adjacent to the bottom partition plate member for stopping and positioning the vehicle on the bottom partition plate member.

7. A transfer system as recited in claim 6, wherein the third station member comprises a bottom closure means, mounted to the bottom wall at the other end thereof, for allowing the vehicle to enter into and exit from the third station member, wherein the corresponding ARM is located just below the bottom closure means, and wherein the delivering means comprises vertically moving means for vertically moving the vehicle between the third station member and the corresponding ARM through the bottom closure means.

* * * * *